United States Patent [19]
Soo et al.

[11] Patent Number: 5,237,481
[45] Date of Patent: Aug. 17, 1993

[54] TEMPERATURE SENSING DEVICE FOR USE IN A POWER TRANSISTOR

[75] Inventors: David H. Soo, Sunnyvale; Richard A. Blanchard; Nathan Zommer, both of Los Altos, all of Calif.

[73] Assignee: Ixys Corporation, San Jose, Calif.

[21] Appl. No.: 706,835

[22] Filed: May 29, 1991

[51] Int. Cl.$^5$ ............................................. H02H 5/04
[52] U.S. Cl. ..................................... 361/103; 323/907; 257/467
[58] Field of Search ................ 361/103; 307/491, 117; 357/28; 323/907

[56] References Cited

U.S. PATENT DOCUMENTS

| | | | |
|---|---|---|---|
| 4,446,419 | 5/1984 | Plassche et al. | 323/907 |
| 4,682,195 | 7/1987 | Yilmaz | 357/23.4 |
| 4,881,120 | 11/1989 | Nakagawa et al. | 357/23.4 |
| 5,063,342 | 11/1991 | Hughes et al. | 323/907 |

OTHER PUBLICATIONS

S. Soclof, "Applications of Analog Integrated Circuits," Prentice Hall (1985) pp. 273–284.

Primary Examiner—Todd E. DeBoer
Attorney, Agent, or Firm—Townsend and Townsend Khourie and Crew

[57] ABSTRACT

A semiconductor diode array monolithically integrated onto a power MOS transistor or power IGBT for temperature sensing. With the application of a positive bias and a constant current, the diode array provides a voltage that varies linearly as a function of temperature for the power transistor. The diode array is constructed in such a manner so as to prevent latch-up (i.e. where a parasitic silicon controlled rectifier is turned on, locking the power transistor in an on condition) and voltage breakdown (i.e. where the diode malfunctions from excessive voltage). The diode array includes at least three diodes that are either in parallel or are in series. The two types of diode array can be used in either a high-side driver circuit or a low-side driver circuit.

11 Claims, 2 Drawing Sheets

TEMPERATURE SENSING DEVICE FOR USE IN A POWER TRANSISTOR

BACKGROUND OF THE INVENTION

This invention relates to temperature sensing of a power transistor and more particularly to a monolithic temperature sensing element integrated within a power MOS transistor or a power IGBT (insulated gate bipolar transistor).

Most failures of power transistors in electronic circuits are due to overheating caused by excessive current. Thus, the incorporation of temperature sensing improves the overall reliability of a system incorporating power devices. In a typical prior art system, as a power transistor begins operating at an excessive temperature, a temperature sensor detects that excessive temperature, and sends a signal to a control circuit. The control circuit then turns off the power transistor or decreases its current load. However, to be effective, such temperature sensors must be accurate and quick to respond to changes in temperature. Otherwise, the power transistor could fail before the excess temperature is detected and corrective action taken.

Crude mechanical thermostats are sometimes attached to the heat sink of a power transistor to sense temperature. However, such mechanical thermostats are not reliable and do not easily interface with control circuits.

Electronic temperature sensors are often glued or attached to the heat sink or package of the power transistor. Such external temperatures sensors are not in close proximity to the power transistor, and thus there is a significant time delay between the temperature rise in the power transistor and the sensor's detection of that temperature rise. As a result, power transistors might fail before the excessive temperature is detected.

Another type of temperature sensor called a PTAT (Proportional To the Absolute Temperature) is sometimes monolithically integrated with the power device. PTATs are temperature-sensitive semiconductor circuits that generate a voltage or current that is proportional to the absolute temperature. Because of this relationship, fewer external components are needed in the control circuit to sense temperature, and the control circuit can more easily determine the actual temperature of the power transistor being monitored. Therefore, the control circuit can better determine the appropriate corrective action to follow to protect the power transistor. Because they are monolithically integrated with the power transistor, PTATs are quicker to detect changes in the power transistor temperature. In addition, they only require two leads out of the power transistor package. However, PTATs are not capable of detecting temperature in high voltage power transistors. If the power transistor handles more than 20 volts, the PTAT suffers from voltage breakdown and ceases functioning properly. Therefore, PTATs cannot be used to detect temperature in most power transistors. PTATs are described in greater detail in Soclof, S., "Applications of Analog Integrated Circuits", Prentice Hall (1985) pp. 273-284.

Power MOSFETs have an on-resistance that varies linearly with temperature. Patent application Ser. No. 223,059, filed Jul. 22, 1988 and titled HIGH POWER MOS TRANSISTOR WITH VOLTAGE, TEMPERATURE, CURRENT, AND POWER SENSING CAPABILITY discloses a technique for monitoring device temperature using current mirrors. However, this technique is not effective with IGBTs which do not exhibit similar linear behavior with respect to temperature.

Temperature sensing of power MOS transistors and MOS gated IGBTs has also been accomplished using a pn-junction diode built into the substrate along with the device, or by using a pn-junction diode fabricated in a polycrystalline silicon layer deposited on a dielectric layer over the silicon substrate. Such an approach is disclosed in U.S. patent application Ser. No. 295,956 filed Jan. 10, 1989 titled MONOLITHIC TEMPERATURE SENSING DEVICE. However, there are occasions where enhanced temperature sensing capability is needed.

It is well known that the absolute value of the voltage drop across a diode at a given temperature for a set current is a strong function of the diode geometry and the process sequence, but that it is also a weak function of other variables. The variances in diode geometry, etc., limit the accuracy of making temperature measurements using uncharacterized diodes.

SUMMARY OF THE INVENTION

According to the present invention, a semiconductor power device having a power transistor coupled to a temperature sensing means is disclosed that allows the temperature of the transistor to be detected. The temperature sensing means includes a diode array having three diodes intercoupled to form a voltage differential circuit for sensing a change in voltage due to a change in temperature in the power device. Since two (or more) diodes on the same die have a high probability of having the same characteristics, such as dopant concentration and geometry, that are nearly identical for identical diodes, a more accurate temperature reading is obtained. More specifically, both a parallel diode array and a serial diode array are disclosed that allow the temperature of a given device to be accurately monitored, while cancelling out "common mode" effects, such as parasitic transistor action.

The voltage differential circuit provides the forward bias across the diode array and constant current through the diode array. The voltage differential circuit determines the temperature of the power transistor from the forward voltage across the diode array. As a result of the construction and connections of the diode array, the temperature sensor is able to function whether the power transistor is on or off.

Because the diode array is located on the power transistor, the temperature sensor responds quickly to changes in temperature. Therefore, the control circuitry can take corrective action before the power transistor is damaged by excessive temperature. Because the diode array is isolated from the drain, it can withstand the high voltages of a power transistor. In addition, the diode functions at a high enough voltage level (100 to 300 millivolts) to overcome noise interference from the power transistor.

For a further understanding of the nature and advantages of the invention, reference should be had to the ensuing detail description taken in conjunction with the accompanying drawings.

BRIEF DESCRIPTION OF THE DRAWINGS

FIG. 2b is a schematic diagram of the series diode array as described in FIG. 2a;

DETAILED DESCRIPTION OF THE PREFERRED EMBODIMENTS

Figure 1A:
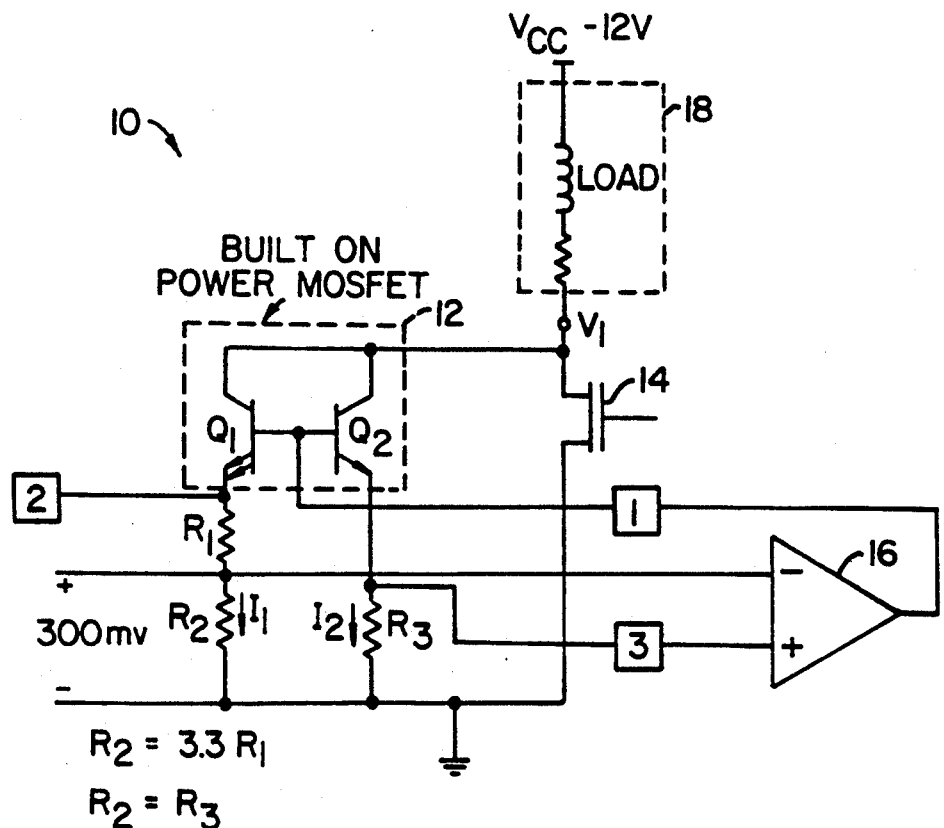
FIG. 1a is a schematic drawing of an FET with preferred temperature sensing diodes in parallel.

FIG. 1a shows a low-side driver circuit 10 having a parallel diode array 12 built on a power MOS device 14. At least a first and second diode $Q_1$ and $Q_2$ are fabricated in a lightly doped N− region using a P+ deep body diffusion and an N+ source diffusion. Such a fabrication process actually results in diodes that have parasitic "transistor" characteristics. It is these "transistors" that are illustrated, and are referred to as "diodes" through the rest of this disclosure. Diode $Q_1$ actually consists of at least two identical diodes in parallel, with diode $Q_2$ being a separate diode for connection in a differential circuit. Therefore, for this embodiment, at least three diodes are needed to form diode array 12. Though diode $Q_1$ can have as few as two diodes, there is no upper limit to the number of diodes allowable. In the preferred mode, diode $Q_1$ consists of 14 diodes in parallel.

A first and second resistor $R_1$ and $R_2$ are serially connected between the emitter or cathode lead of diode $Q_1$ and ground, and a third resistor $R_3$ is connected between the emitter lead of diode $Q_2$ and ground. The negative input of a operational amplifier 16 (herein "op amp") connects between resistors $R_1$ and $R_2$ while the positive input connects between the emitter lead of diode $Q_2$ and resistor $R_3$. Op amp 16 is used to drive the bases for diodes $Q_1$ and $Q_2$ so that current $I_1$ equals current $I_2$. In a preferred embodiment, resistors $R_2$ and $R_3$ have the same value, while $R_1$ is one third the value of either resistor $R_2$ or $R_3$. In addition, resistors $R_1$, $R_2$, $R_3$ and op amp 16 are made on a separate IC from that on which the power device and diode array 12 are fabricated. Proper leads on the second IC allow interconnection with the power device IC. The lead design for both ICs is within the ability of the skilled artisan and is not to be considered as part of the novelty of the present invention.

The diode array 12 is connected in parallel with MOS device 14. Connected above MOS device 14 is a load circuit 18 which has a voltage $V_{cc}$ connected thereto. Load circuit 18 can be any desired circuit used for power applications such as in an automotive ignition coil. An example of such a circuit is shown in load circuit 18 that includes an inductor L and a resistor R. Load circuit 18 is a separate circuit from the IC on which MOS device 14 and diode array 14 are fabricated.

In operation, the voltage at $V_1$ is approximately 400 mV during the ON state of MOS device 14. This allows diodes $Q_1$ and $Q_2$ to operate in the forward direction. Thereafter, control circuitry (not shown), further connected to the emitter leads of diodes $Q_1$ and $Q_2$, allows for protective action to be taken to limit the exposure of power device 14 to extreme temperature. Such protective action occurs when a present deficient voltage is "registered" between diodes $Q_1$ and $Q_2$. This causes the difference in the $V_{BE}$ voltages of $Q_1$ and $Q_2$ to be forced across the resister $R_1$. This $\Delta V_{BE}$ voltage is multiplied (using $R_2$) to create a voltage equal to $\Delta V_{BE} \times R_2/R_1$ which develops across $R_2$. The maximum voltage across $R_2$, without putting $Q_1$ in the saturation region, is approximately 300 mV. The control circuitry used to protect power device 14 is well known and within the ability of one skilled in the art.

When MOS device 14 is in the OFF state, $V_1$ is approximately 12 volts. The off state will not allow diodes $Q_1$ and $Q_2$ to saturate because the voltage on $V_1$ is greater than 400 mV. Operation of circuit 10 in the OFF state is the same as in the ON state explained above.

Figure 1B:
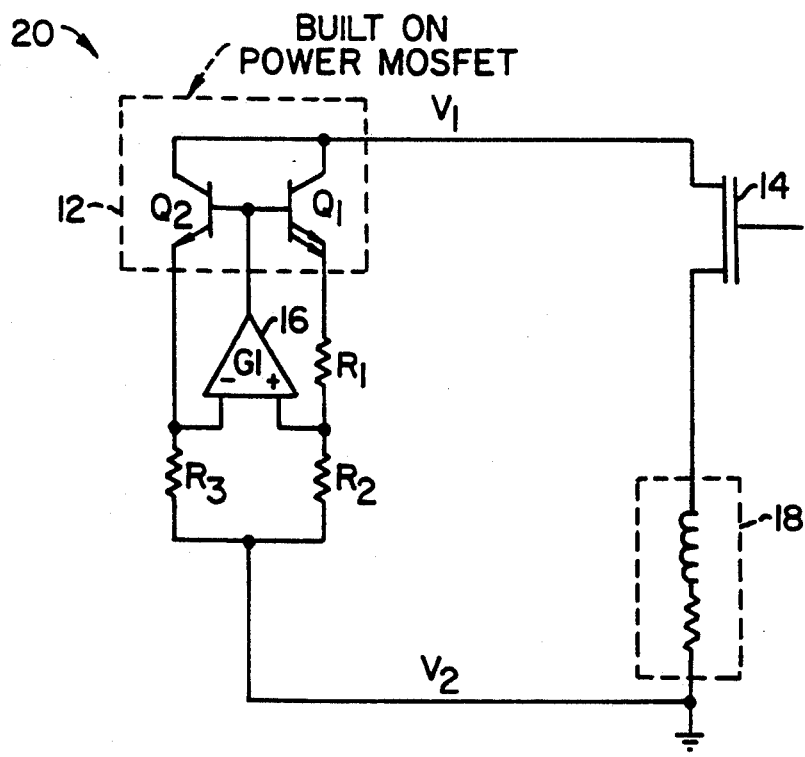
FIG. 1b is a schematic drawing of an FET with the preferred temperature sensing diodes in a second embodiment.

A second embodiment using the parallel diode array 12 is illustrated in schematic FIG. 1b. In this application, load 18 is below MOS device 14, allowing MOS device 14 to function as a high-side driver. In addition, resistors $R_1$ and $R_2$ are connected serially between the emitter lead of diode $Q_1$ and ground with resistor $R_3$ connected between the emitter of diode $Q_2$. The input leads of op amp 16 are connected such that the negative lead connects between resistors $R_1$ and $R_2$ and the positive lead connects between the emitter of diode $Q_2$ and resistor $R_3$. The output lead of op amp 16 is connected to the bases of diodes $Q_1$ and $Q_2$. Again, diode array 12 is fabricated on the same integrated circuit as MOS device 14, while the remaining components in the circuit usually are fabricated on a separate substance from the MOS device/diode array, however, this need not be the case.

In operation, the voltage between $V_1$ and $V_2$ is constant whether MOS device 14 in the ON or the OFF state. The operation of circuit 20 is the same as the low-side application explained above. This circuit arrangement does not allow diodes $Q_1$ and $Q_2$ to saturate because the voltage between $V_1$ and $V_2$ is greater than 400 mV. Well known control circuitry (not shown) is also provided to protect MOS device 14 in the event of a changing, elevated temperature, as observed by diodes $Q_1$ and $Q_2$.

Figure 2A:
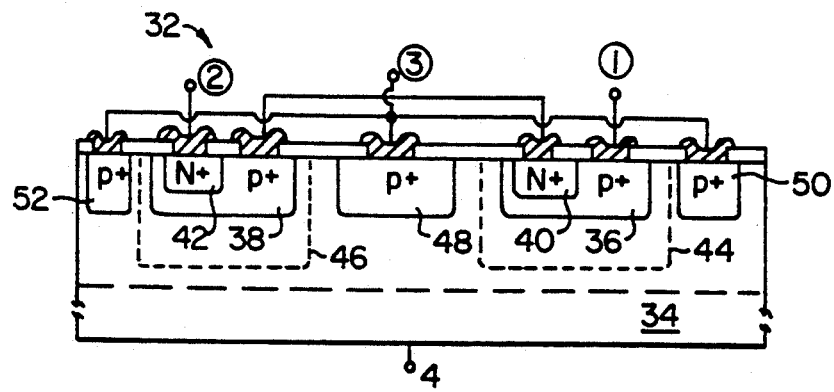
FIG. 2a is a cross-sectional diagram of a series diode array according to the present invention.

Another embodiment of the present invention uses sensing diodes in series fabricated on the same MOS device. FIG. 2a shows a cross-sectional view of a series diode array 32 formed in a substrate 34. Substrate 34 is doped with an N-type dopant and serves as the collector for the diodes in diode array 32. A first and second base region 36 and 38 of P+ type dopant are formed in substrate 34. A first and second emitter region 40 and 42 are formed in base regions 36 and 38, respectively. Substrate 34, base region 36 and emitter region 40 form a first diode 44 and substrate 34, base region 38 and emitter region 42 form a second diode 46. A third P+ type region 48 is formed between diode 44 and diode 46. On the outside of both diodes 44 and 46 are P+ type regions 50 and 52, respectively.

Figure 2B:
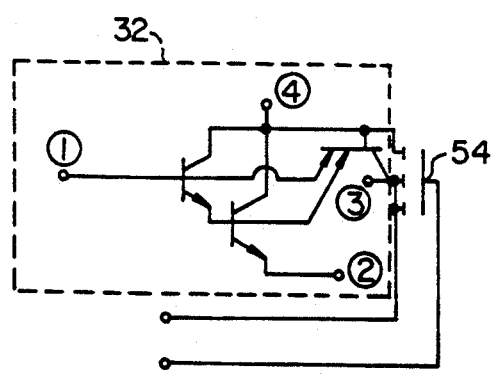

The current gain of the "transistor" forming the temperature sensing diode array 32 is much less than one; therefore, there is no concern about latch-up caused by a parasitic NPN transistor if a series combination is used. However, the presence of P+ regions adjacent to each other with different potentials may activate the intrinsic lateral PNP transistor formed between two adjacent P+ regions in the N-type epitaxial region. One method for avoiding this problem is shown in FIG. 2a and schematically in FIG. 2b.

Series diodes 44 and 46 are between terminals 1 and 2. A terminal 3 connected to P+ type region 48 is connected to the source terminal of a power MOSFET 54 or to ground (whichever is lower) to prevent the lateral PNP transistor formed by the P+ type regions 36 and 38 of series diodes 44 and 46 from turning on.

Figure 3A:
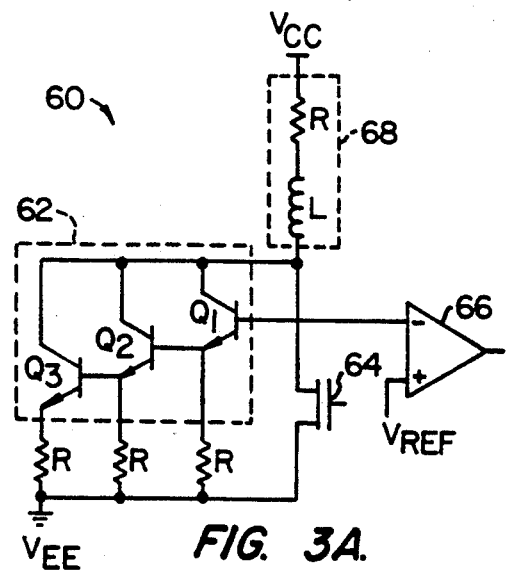
FIG. 3a is a schematic diagram of a power device using a temperature sensing series diode array.
Figure 3B:
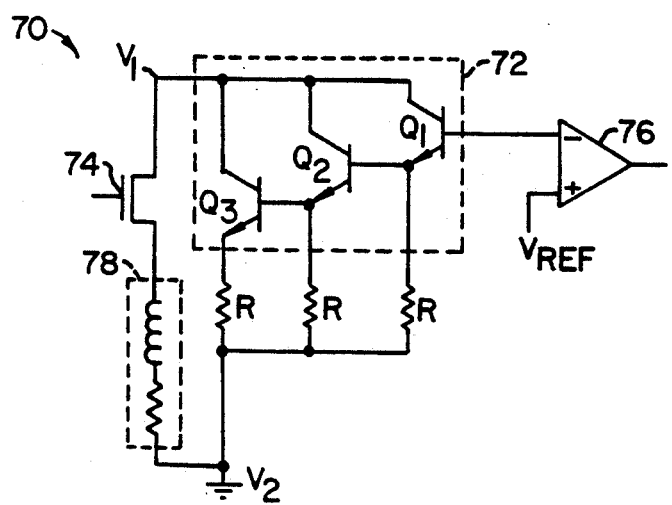
FIG. 3b is a schematic diagram of a power device using a series diode array in a second embodiment.

Series diode arrays are used in both low-side and high-side driver ICs, as shown in FIGS. 3a and 3b, respectively.

FIG. 3a schematically represents a low-side driver circuit 60. A series diode array 62 is connected in parallel with a power device 64. Series diode array 62 has three diodes $Q_1$, $Q_2$ and $Q_3$ serially connected and have a common collector connection. Each diode $Q_1$, $Q_2$, $Q_3$ has a resistor R connected between its respective emitter lead and $V_{EE}$. A load circuit 68 is connected between $V_{cc}$ and the collector contact of diode array 62 and the source of power device 64. The base of diode $Q_1$ is connected to the negative input of a comparator 66. The positive input of comparator 66 is connected to a voltage $V_{ref}$.

During the ON state of power device 64, diode $Q_1$ will not be biased in diode array 62 since there is less than $3 \times V_{BE}$ voltage on the drain of power device 64.

During the OFF state of power device 64, triple diodes $Q_1$, $Q_2$, and $Q_3$ will average out any singular problem with any one diode. Therefore, the three diodes will set up a consistent reference that would trip comparator 66 at a predefined voltage $V_{ref}$.

A high-side driver circuit 70 is schematically represented in FIG. 3b. A series diode array 72, having three diodes $Q_1$, $Q_2$, and $Q_3$, is connected with the collector end to the drain contact of a power device 74 and the emitter end to $V_2$. Each diode also has a resistor R connected between the emitter and $V_2$. The base of diode $Q_1$ is coupled to the negative input of a comparator 76 with the positive input to comparator 76 connected to a voltage $V_{ref}$. A load circuit 78 interconnects the drain contact of power device 74 and the emitter lead of diode array 72.

During operation, the voltage between $V_1$ and $V_2$ is constant whether power device 74 is in the ON or OFF state. The voltage $V_1$ indicates the sum of three $V_{BE}$ voltages which is then compared to a temperature independent reference $V_{ref}$.

The above circuits using parallel or series diodes for temperature sensing are used as examples. It is also possible to use series/parallel combinations and to build additional circuitry such as resistors, diodes, and transistors on the power device die. In addition, the power device is preferably either a MOSFET or insulated gate bipolar transistor (IGBT), or any other type of power transistor needing protection from higher temperatures.

While the control circuitry has been described as on a separate IC from the power transistor, the control circuitry that utilizes the temperature sensing diode arrays may also be located on the power transistor chip. This includes, but is not limited to, control circuitry for determining whether the chip has exceeded a designated temperature and control circuitry for turning off the power transistor when the designated temperature is exceeded.

While the above description provides a full and complete disclosure of the preferred embodiments of the invention, various modifications, alternate constructions, and equivalents may be employed. Accordingly, the above description and illustration should not be construed as limiting the scope of the invention, which is defined by the appended claims.

What is claimed is:

1. A semiconductor power device comprising a power transistor coupled to a temperature sensing means, the temperature sensing means comprising a diode array having a first diode, a second diode, and a third diode wherein the diodes are intercoupled to form a voltage differential circuit for sensing a change in voltage from a first voltage potential to a second voltage potential due to a change in temperature in the power device.

2. The semiconductor power device of claim 1 wherein the power transistor comprises a power MOS transistor.

3. The semiconductor power device of claim 1 wherein the power transistor comprises a power insulated gate bipolar transistor (IGBT).

4. The semiconductor power device of claim 1 wherein the first, second and third diodes are each in a series combination with at least one resistive element, the series combinations being coupled in parallel between a first voltage source and a second voltage source, with the first and second diodes having a common cathode lead.

5. The semiconductor power device of claim 1 wherein the first, second and third diodes are coupled in series between a first voltage source and a second voltage source.

6. The semiconductor power device of claim 1 further comprising comparator circuitry electrically coupled to the temperature sensing device.

7. The semiconductor power device of claim 6 wherein the comparator circuitry further comprises a first resistor coupled between the cathode of the first diode and the second voltage potential, a second resistor coupled between the cathode of the second diode and the second voltage potential, a third resistor coupled between the cathode of the third diode and the second voltage potential, and a comparator circuit coupled to at least one of the diodes.

8. The semiconductor power device of claim 6 wherein the comparator circuit has a first lead coupled to the first diode through a resistive element, a second lead coupled to the third diode, and a third lead coupled to all of the diodes.

9. The semiconductor power device of claim 7 wherein the comparator circuit has a first lead coupled to the first diode, a second lead coupled to a third voltage, and a third lead coupled to means for disabling the power device.

10. A semiconductor power device comprising a power transistor coupled to a temperature sensing means, the temperature sensing means comprising:

a transistor array formed in an integrated circuit with the power transistor, the transistor array having a first transistor, a second transistor and a third transistor, each of the transistors being in a series combination with at least one resistive element, the series combinations being connected in parallel between a first voltage source and a second voltage source, with the first and second transistor having a commonly coupled emitter lead and the three transistors having a commonly coupled base lead; and comparator means for detecting a change of voltage between a first voltage across the first and second transistors and a second voltage across the third transistor, the comparator means further comprising:

a first resistor and a second resistor serially coupled between the first and second transistor and the second voltage source to form a first current line, and a third resistor coupled between the third transistor and the second voltage source to form a second current line; and an amplifier circuit, the amplifier circuit having a first input coupled between the first and second resistor, a second input coupled between the third transistor and third resistor, and an output coupled to base lead so that equal current can be maintained across the first current line and across the second current line.

11. A semiconductor power device comprising a power transistor coupled to a temperature sensing means, the temperature sensing means comprising:

a diode array formed in an integrated circuit with the power transistor, the diode array having a first diode, a second diode and a third diode connected in series between a first voltage potential and a second voltage potential; and comparator means for detecting a change of temperature of the power transistor due to a chance of voltage between the first voltage potential and the second voltage potential as compared to a third voltage potential, the comparator means comprising:

a first resistor coupled between the first diode and the second voltage potential, and second resistor coupled between the second diode and second voltage potential and a third resistor coupled between the third diode and the second voltage potential; and a comparator circuit, the comparator circuit having a first input coupled to the base of the first diode, a second input coupled to the third voltage potential, and an output coupled to power device disabling means for disabling the power device at a given temperature.

* * * * *